(12) United States Patent
Kim et al.

(10) Patent No.: US 11,728,255 B2
(45) Date of Patent: Aug. 15, 2023

(54) INTERPOSER AND SEMICONDUCTOR PACKAGE INCLUDING SAME

(71) Applicant: SAMSUNG ELECTRONICS CO., LTD., Suwon-si (KR)

(72) Inventors: Ungcheon Kim, Cheonan-si (KR); Sungwoo Park, Seongnam-si (KR); Yukyung Park, Hwaseong-si (KR); Seungkwan Ryu, Seongnam-si (KR)

(73) Assignee: SAMSUNG ELECTRONICS CO., LTD.

( * ) Notice: Subject to any disclaimer, the term of this patent is extended or adjusted under 35 U.S.C. 154(b) by 123 days.

(21) Appl. No.: 17/154,067

(22) Filed: Jan. 21, 2021

(65) Prior Publication Data
US 2022/0013445 A1 Jan. 13, 2022

(30) Foreign Application Priority Data
Jul. 9, 2020 (KR) .................. 10-2020-0084942

(51) Int. Cl.
*H01L 23/498* (2006.01)
*H01L 21/48* (2006.01)
*H01L 25/18* (2023.01)

(52) U.S. Cl.
CPC .... *H01L 23/49822* (2013.01); *H01L 21/4857* (2013.01); *H01L 23/49816* (2013.01); *H01L 23/49838* (2013.01); *H01L 25/18* (2013.01)

(58) Field of Classification Search
CPC .......... H01L 23/49822; H01L 21/4857; H01L 23/49816; H01L 23/49838; H01L 25/18; H10B 80/00
See application file for complete search history.

(56) References Cited

U.S. PATENT DOCUMENTS

| | | | |
|---|---|---|---|
| 7,312,107 B2 | 12/2007 | Noma et al. | |
| 7,790,506 B2 | 9/2010 | Fukuda | |
| 8,058,151 B2 | 11/2011 | Jeng et al. | |
| 10,325,880 B2 | 6/2019 | Woychik et al. | |
| 10,535,554 B2 | 1/2020 | Tang et al. | |
| 10,553,458 B2 | 2/2020 | Qiu et al. | |
| 2015/0214077 A1* | 7/2015 | Tsai | H01L 23/3114 257/737 |
| 2017/0221837 A1* | 8/2017 | Hedrick | H01L 23/49811 |

(Continued)

FOREIGN PATENT DOCUMENTS

| | | |
|---|---|---|
| JP | 2014203868 A | 10/2014 |
| KR | 100950823 | 4/2010 |

*Primary Examiner* — Benjamin Tzu-Hung Liu
(74) *Attorney, Agent, or Firm* — Fish & Richardson P.C.

(57) ABSTRACT

An interposer including a base layer, a redistribution structure on a first surface of the base layer and including a conductive redistribution pattern, a first lower protection layer on a second surface of the base layer, a lower conductive pad on the first lower protection layer, a through electrode connecting the conductive redistribution pattern and the lower conductive pad, a second lower protection layer on the first lower protection layer, including a different material than the first lower protection layer, and contacting at least a portion of the lower conductive pad, and an indentation formed in an outer edge region of the interposer to provide a continuous angled sidewall extending entirely through the second lower protection layer and through at least a portion of the first protection layer.

11 Claims, 21 Drawing Sheets

(56) References Cited

U.S. PATENT DOCUMENTS

2019/0214533 A1    7/2019  Rudmann et al.
2020/0090954 A1    3/2020  Lin et al.
2021/0407920 A1*  12/2021  Chen .................... H01L 21/568

* cited by examiner

INTERPOSER AND SEMICONDUCTOR PACKAGE INCLUDING SAME

CROSS-REFERENCE TO RELATED APPLICATION

This application claims priority under 35 U.S.C. § 119 to Korean Patent Application No. 10-2020-0084942, filed on Jul. 9, 2020, in the Korean Intellectual Property Office, the subject matter of which is hereby incorporated by reference.

BACKGROUND

The inventive concept relates to interposers and semiconductor packages including same.

With the rapid development of electronics and expanding user requirements, electronic devices have generally become more physically compact, capable of providing greater functionality, and very demanding in terms of data (e.g., data capacity, data speed, etc.). Accordingly, semiconductor packages including multiple semiconductor chips are required. That is, with denser integration density of semiconductors, contemporary electronic devices frequently omit printed circuit board(s). In order to realize such dense integration density, semiconductor packages often include an interposer disposed between semiconductor chip(s) and a package substrate.

SUMMARY

Embodiments of the inventive concept provide interposers having increased reliability and semiconductor packages including such interposers.

According to an aspect of the inventive concept, there is provided a semiconductor package including; a package substrate, an interposer mounted on the package substrate, and a semiconductor chip mounted on the interposer. The interposer may include; a base layer including a first surface and a second surface opposite the first surface, a redistribution structure on the first surface of the base layer, configured to mount the semiconductor chip and including a conductive redistribution pattern, a first lower protection layer on the second surface of the base layer, a lower conductive pad on the first lower protection layer, a through electrode passing through the base layer and the first lower protection layer to electrically connect the conductive redistribution pattern to the lower conductive pad, a second lower protection layer on the first lower protection layer and contacting at least a portion of the lower conductive pad, and an indentation formed in an outer edge region of the interposer to provide a continuous sidewall extending through at least a portion of the second lower protection layer.

According to an aspect of the inventive concept, there is provided an interposer including; a base layer including a first surface and a second surface opposite the first surface, a redistribution structure on the first surface of the base layer and including a conductive redistribution pattern, a first lower protection layer on the second surface of the base layer, a lower conductive pad on the first lower protection layer, a through electrode connecting the conductive redistribution pattern and the lower conductive pad, a second lower protection layer on the first lower protection layer and contacting at least a portion of the lower conductive pad, and an indentation formed in a scribe lane region proximate to an outer edge region of the interposer to provide a continuous curvilinear sidewall extending entirely through the second lower protection layer and through at least a portion of the first protection layer.

According to an aspect of the inventive concept, there is provided an interposer including; a base layer including a first surface and a second surface opposite the first surface, a redistribution structure on the first surface of the base layer and including a conductive redistribution pattern, a first lower protection layer on the second surface of the base layer, a lower conductive pad on the first lower protection layer, a through electrode connecting the conductive redistribution pattern and the lower conductive pad, a second lower protection layer on the first lower protection layer, including a different material than the first lower protection layer, and contacting at least a portion of the lower conductive pad, and an indentation formed in an outer edge region of the interposer to provide a continuous angled sidewall extending entirely through the second lower protection layer and through at least a portion of the first protection layer.

BRIEF DESCRIPTION OF THE DRAWINGS

The inventive concept may be more clearly understood upon consideration of the following detailed description taken in conjunction with the accompanying drawings in which:

FIG. 8, including the related cross-sectional views

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; inner/outer; thicker/thinner; proximate/distant; above/below; under/over; upper/lower; center/side; between; surrounding; overlay/underlay; etc.

An exemplary set of coordinate axes is included in certain ones of the illustrated embodiments. However, those skilled in the art will recognize that these axes are arbitrary in nature provided for additional clarity. In the exemplary set of coordinate axes, the X direction and the Y directions are assumed to be lateral directions extending substantially in parallel with a primary surface of an interposer, and the Z direction assumed to be a vertical direction extending substantially perpendicular to the primary surface of an interposer.

Figure 1:
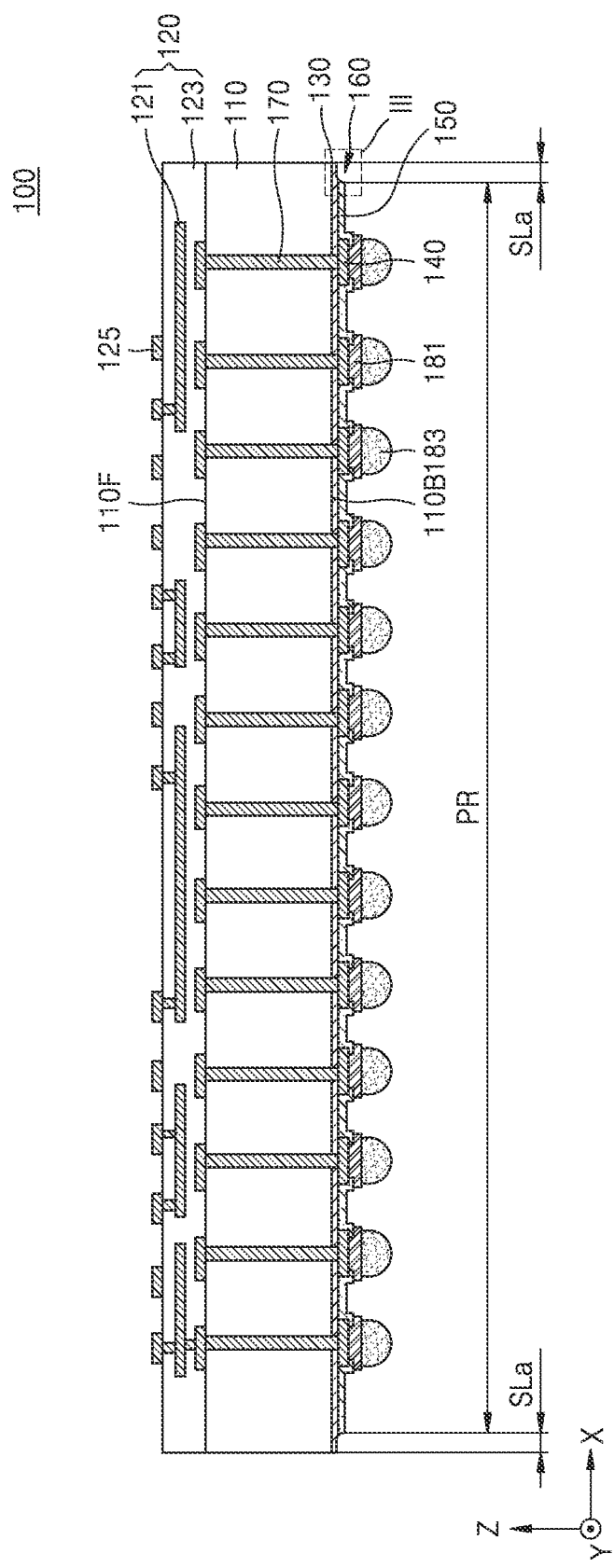
FIG. 1 is a cross-sectional view of an interposer according to embodiments of the inventive concept.
Figure 2:
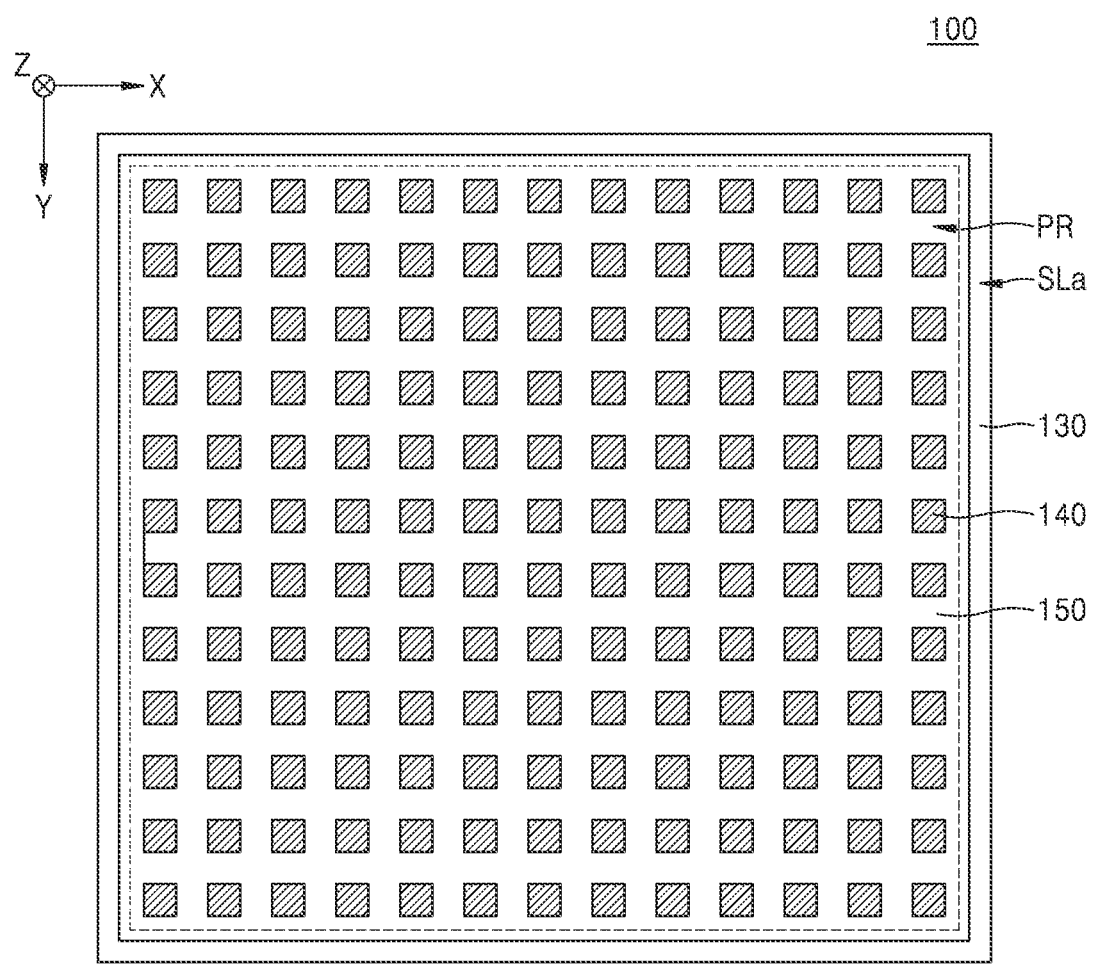
FIG. 2 is a plan (or bottom-up) view of the interposer of FIG. 1.
Figure 3:
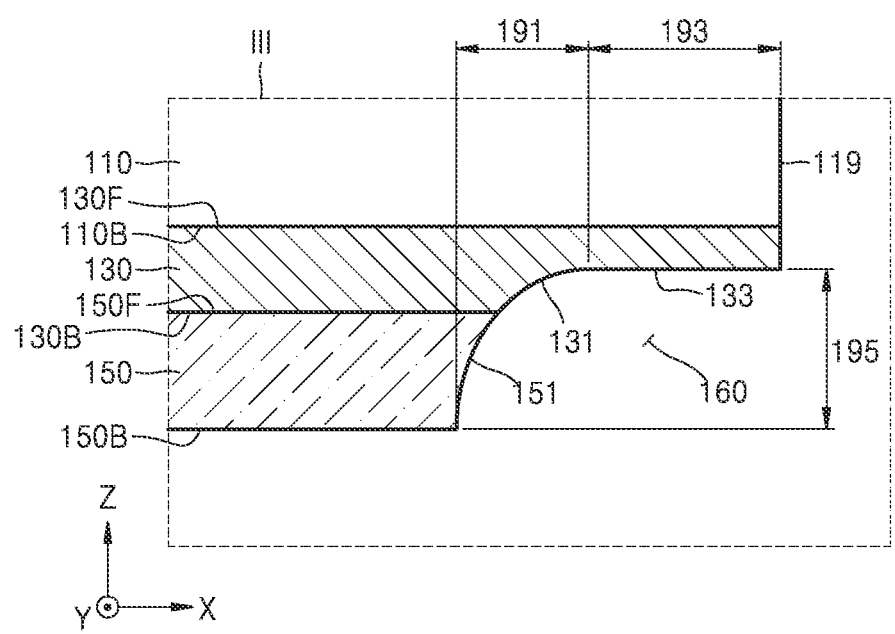
FIG. 3 is an enlarged view of region III in FIG. 1.

FIG. 1 is a cross-sectional view of an interposer 100 according to embodiments of the inventive concept, FIG. 2 is a plan (or bottom-up) view of the interposer 100 of FIG. 1 and FIG. 3 is an enlarged view of region III in FIG. 1. In FIG. 2, the board-to-interposer connector 183 of FIG. 1 is omitted from the interposer 100 for clarity of illustration.

Referring to FIGS. 1, 2 and 3, the interposer 100 may include a base layer 110, a redistribution structure 120, a first lower protection layer 130, a lower conductive pad 140, a second lower protection layer 150, and a through electrode 170.

The base layer 110 may include at least one of a semiconductor material, glass, ceramic and plastic. In some embodiments, the base layer 110 may include a silicon wafer including silicon (Si), (e.g., crystalline silicon, polycrystalline silicon and/or amorphous silicon). The base layer 110 may have a substantially flat shape including a first surface 110F, a second surface 110B opposite the first surface 110F, and an outer (or exterior) wall 119 of the interposer 100 extending between at least the first surface 110F and the second surface 110B of the base layer 110.

The redistribution structure 120 may be disposed on the first surface 110F of the base layer 110. In the illustrated example of FIG. 1, the redistribution structure 120 includes an insulating layer 123 covering the first surface 110F of the base layer 110 and a conductive redistribution pattern 121 sheathed in (or substantially surrounded by) the insulating layer 123. The redistribution structure 120 may include a back-end-of-line (BEOL) structure.

In some embodiments, the insulating layer 123 may include one or more inorganic insulating material, such as for example, an oxide (e.g., silicon oxide) and/or a nitride (e.g., silicon nitride). The insulating layer 123 may be formed, for example, using a plasma-enhanced chemical vapor deposition (PECVD) process. In certain, more particular embodiments, the thickness of the insulating layer 123 (measured in a Z direction perpendicular to the first surface 110F of the base layer 110) may range from between about 8 micrometers (μm) to about 12 μm.

The conductive redistribution pattern 121 may include multiple wiring layers arranged in multiple vertical (e.g., in the Z direction) levels in the insulating layer 123 to form a multi-layer structure. One or more conductive vias may vertically extend through the insulating layer 123 to variously connect the wiring layer and/or additional conductive elements. Although the conductive redistribution pattern 121 of FIG. 1 only shows a 2-level redistribution pattern 121, the inventive concept is not limited thereto. Here, the wiring layers and the conductive vias may include at least one metal (e.g., tungsten (W), aluminum (Al), and copper (Cu)).

An upper conductive pad 125 may be disposed on a top surface of the redistribution structure 120 to variously connect to a semiconductor chip mounted on the interposer 100.

In the foregoing configuration, the first lower protection layer 130 may include a top surface 130F and a bottom surface 130B opposite the top surface 130F and may be disposed to cover the second surface 110B of the base layer 110. Thus, the top surface 130F of the first lower protection layer 130 may contact with the second surface 110B of the base layer 110, and the bottom surface 130B of the first lower protection layer 130 may contact the second lower protection layer 150. (In some embodiments, the bottom surface 130B of the first lower protection layer 130 may also contact at least part of the lower conductive pad 140).

Since the through electrode 170 vertically penetrates the first lower protection layer 130, a portion of the through electrode 170 is surrounded by the first lower protection layer 130 proximate a lower end of the through electrode 170 extending from the second surface 110B of the base layer 110. In some embodiments, the bottom surface 130B of the first lower protection layer 130 may be coplanar with a bottom surface of the through electrode 170 contacting the lower conductive pad 140.

The first lower protection layer 130 may include one or more inorganic insulating material(s), such as for example, an oxide (e.g., silicon oxide) and/or a nitride (e.g., silicon nitride). In some embodiments, the first lower protection layer 130 may be formed using a PECVD process to have a thickness that ranges between about 1.3 μm to about 3.0 μm.

In some embodiments, the first lower protection layer 130 may have a multi-layer structure (e.g., including a vertically stacked arrangement of insulating films). For example, the first lower protection layer 130 may include a first layer contacting the second surface 110B of the base layer 110 and a second layer disposed on the first layer. In such embodiments, the first layer of the first lower protection layer 130 may include silicon oxide—having a relatively high degree of adhesiveness with respect to the base layer 110, whereas the second layer of the first lower protection layer 130 may include silicon nitride.

A plurality of lower conductive pads 140 may be arranged across the bottom surface 130B of the first lower protection layer 130. That is, lower conductive pads 140 may be laterally separated from one another (e.g., in the X direction and/or a Y direction) across the bottom surface 130B of the first lower protection layer 130. In some arrangements, a two-dimensional array of lower conductive pads may be provided on the bottom surface 130B of the first lower protection layer 130. Thus, the lower conductive pads 140 may be arranged in a designated pattern region PR of the base layer 110.

In some embodiments, the lower conductive pad 140 may have a relatively uniform thickness ranging from between about 3 μm to about 5 μm. The lower conductive pad 140 may include a top surface contacting the first lower protection layer 130 and/or the through electrode 170 as well as a bottom surface opposite the top surface, wherein the top and bottom surfaces of the lower conductive pad 140 may have a substantially flat surface. The lower conductive pad 140 may include at least one metal, such as W, Al, and Cu, and have a polygonal shape (e.g., a quadrangular shape, a hexagonal shape, a circular shape or an oval shape).

With any one of the foregoing, exemplary configurations, the lower conductive pad 140 may be connected to the board-to-interposer connector 183.

The second lower protection layer 150 may cover the bottom surface 130B of the first lower protection layer 130. The second lower protection layer 150 may also cover a portion of the lower conductive pad 140. Accordingly, the second lower protection layer 150 may have a top surface 150F contacting the bottom surface 130B of the first lower protection layer 130, as well as a bottom surface 150B opposite the top surface 150F. The second lower protection layer 150 may include an opening exposing a portion of a bottom surface of the lower conductive pad 140. (Here, the board-to-interposer connector 183 may be connected (e.g.,) to the lower conductive pad 140 through the opening of the second lower protection layer 150). In some embodiments, the thickness of the second lower protection layer 150 may range from about 5 μm to about 8 μm.

In some embodiments, the second lower protection layer 150 may include one or more different material(s) from the one or more material(s) included in the first lower protection layer 130. Thus, the first lower protection layer 130 may include an inorganic insulating material, whereas the second lower protection layer 150 may include an organic insulating material. In some more particular embodiments, the second lower protection layer 150 may include a photo imageable dielectric (PID), such as polyimide (PI) or polybenzoxazole (PBO). In other embodiments, the second lower protection layer 150 may one or more inorganic insulating material(s).

However, when the second lower protection layer 150 includes an organic material and the first lower protection layer 130 includes an inorganic material, a tensile stress provided by the second lower protection layer 150 may be offset, wholly or in part, by a compressive stress provided by the first lower protection layer 130.

The interposer 100 of FIG. 1 may further include a lower connection pillar 181 disposed on the lower conductive pad 140. The lower connection pillar 181 may be connected to the lower conductive pad 140 through the opening of the second lower protection layer 150, such that the lower connection pillar 181 contacts a portion of the second lower protection layer 150 and the second lower protection layer 150 covers at least an edge portion of the bottom surface of the lower conductive pad 140.

Here, the lower connection pillar 181 may function as under bump metallurgy (UBM). For example, the board-to-interposer connector 183—which may be used to connect the interposer 100 to (e.g.,) a printed circuit board (PCB)—may be attached to the lower connection pillar 181. The lower connection pillar 181 may include at least one of nickel (Ni), Cu, palladium (Pd), platinum (Pt), gold (Au), or a combination thereof, and may be formed to have a thickness ranging from between about 2.5 am to about 3.5 am. However, in some embodiments, the lower connection pillar 181 may be omitted.

The through electrode 170 may be configured to electrically connect the conductive redistribution pattern 121 of the redistribution structure 120 to the lower conductive pad 140. Thus, the through electrode 170 may vertically extend from the first surface 110F of the base layer 110 to the second surface 110B of the base layer 110. Additionally, the through electrode 170 may pass through the first lower protection layer 130 which is disposed on the second surface 110B of the base layer 110. With this configuration, an upper end of the through electrode 170 connects the conductive redistribution pattern 121 of the redistribution structure 120 and a lower end of the through electrode 170 connects the lower conductive pad 140.

The through electrode 170 may be variously formed (e.g.,) as a conductive plug having a substantially pillar (or cylindrical) shape extending through the base layer 110 and the first lower protection layer 130. A conductive barrier film may be provided as part of the through electrode 170 and may include at least one of Ti, TiN, Ta, TaN, Ru, Co, Mn, WN, Ni, and NiB, whereas the conductive plug substantially forming the through electrode 170 may include at least one of copper alloys (e.g., Cu, CuSn, CuMg, CuNi, CuZn, CuPd, CuAu, CuRe, and CuW), tungsten alloys, Ni, Ru, and Co. Optionally and additionally, a via insulating film 171 may be provided between the base layer 110 and the through electrode 170. (See, e.g., FIG. 8). The via insulating film 171 may include an oxide film, a nitride film, a carbide film, a polymer, or a combination thereof. In some embodiments, an aspect ratio of the through electrode 170 (e.g., a ratio of the height and width of the through electrode 170) may range from about 7 to about 9.

With reference to FIG. 3, an indentation (or notch) 160 may be formed in an outer edge of the interposer 100 (e.g., in relation to the outer wall 119 associated with the second surface 110B of the base layer 110). That is, the indentation 160 may extend into an outer edge region of the second lower protection layer 150 and an outer edge region of the first lower protection layer 130. The indentation 160 may be formed with one of a variety of vertical profiles (e.g., in the Z direction). For example, the indentation 160 may be formed with a curvilinear or an angled profile.

In some embodiments like the one illustrated in FIG. 1, the indentation 160 may be disposed in a scribe lane region SLa (or what remains of a scribe lane region SLa) of the second surface 110B of the base layer 110. In this regard, the remaining scribe lane region SLa may be provided in an outer region of the second surface 110B of the base layer 110 surrounding the pattern region PR. The remaining scribe lane region SLa may proximate to the outer wall 119 of the base layer 110. For example, in some embodiments, the remaining scribe lane region SLa may be not farther from the outer wall 119 that a first distance ranging from about 150 μm to about 200 μm.

It should be noted here that the indentation 160 may be variously formed using a variety of techniques to selectively remove an outer edge portion of the second lower protection layer 150 and possibly also an outer edge portion of the first lower protection layer 130 and/or an outer edge portion of the base layer 110. Thus, in some embodiments, a relatively linear portion of the indentation 160 may extend along the lower edge of the base layer 110 until reaching a curvilinear portion of the indentation 160 that bends away (in the Z direction) from the lower edge of the base layer 110 and extends through at least a portion of the thickness of the first lower protection layer 130 and the entire thickness of the second lower protection layer 150.

Thus, in some embodiments, the indentation 160 may extend from the bottom surface 150B of the second lower protection layer 150 to the second surface 110B of the base layer 110. For example, the indentation 160 may extend from the bottom surface 150B of the second lower protection layer 150 through the top surface 150F of the second lower protection layer 150, and then may further extend into at least a portion of the first lower protection layer 130.

However specifically formed, the resulting indentation 160 may provide a continuous sidewall on the outer edge of the interposer 100. This continuous sidewall may have (e.g.,) a curvilinear profile or an angled (or angular) profile. Assuming a curvilinear profile, the indentation 160 may include a second curvilinear sidewall 151 formed in the second lower protection layer 150, a first curvilinear sidewall 131 formed in the first lower protection layer 130, and a linear sidewall 133 formed in the first lower protection layer 130. In this regard, the term "curvilinear" denotes a substantially curved (or rounded) profile when viewed in vertical cross-section, and the term "linear" denotes a substantially straight (or non-curved) profile when viewed in vertical cross-section. Further, the term "continuous" denotes a sidewall surface that is smooth and free from discontinuous transitions, like those that may occur between disparate material layers.

In the foregoing context, the second curvilinear sidewall 151 may be disposed more inwardly (or away) from the outer wall 119 than the first curvilinear sidewall 131, and the first curvilinear sidewall 131 may be disposed more inwardly from the outer wall 119 than and the linear sidewall 133.

In the illustrated example of FIG. 3, the second curvilinear sidewall 151 and the first curvilinear sidewall 131 form a continuous curvilinear surface (e.g., a partial concaved arc)

extending from the bottom surface 150B of the second lower protection layer 150 to a point within the first lower protective layer 130 at which the linear sidewall 133 begins. Here, the linear sidewall 133 extends at least to the vertical plane defined by the outer wall 119.

However, in other embodiments, the second curvilinear sidewall 151 of the second lower protection layer 150 and the first curvilinear sidewall 131 of the first lower protection layer 130 may have the same, different and/or varying radii of curvature.

Thus, the second curvilinear sidewall 151 of the second lower protection layer 150 may directly connect with the first curvilinear sidewall 131 of the first lower protection layer 130, and in such configurations the second curvilinear sidewall 151 of the second lower protection layer 150 and the first curvilinear sidewall 131 of the first lower protection layer 130 may have the same slope at a connecting "border." Hence, the combination of the second curvilinear sidewall 151 of the second lower protection layer 150 and the first curvilinear sidewall 131 of the first lower protection layer 130 may be said to be continuous.

In some embodiments, at the border between the second curvilinear sidewall 151 of the second lower protection layer 150 and the first curvilinear sidewall 131 of the first lower protection layer 130, an angle between the tangent line of the sidewall 151 of the second lower protection layer 150 and a direction (e.g., the X direction) parallel with the second surface 110B of the base layer 110 and an angle between a connecting tangent line (measured in the X direction parallel with the second surface 110B of the base layer 110) may range from between about 35 degrees to about 55 degrees.

In some embodiments, the linear sidewall 133 may extend outwardly from the first curvilinear sidewall 131 of the first lower protection layer 130 substantially in parallel with the second surface 110B of the base layer 110. In some particular embodiments, the linear sidewall 133 may extend a second lateral distance 193 (e.g., measured in the X direction parallel with the second surface 110B of the base layer 110 from the outer wall 119) ranging from between about 140 µm to about 170 µm.

In some embodiments, the indentation 160 may have a depth 195 equal to a sum of the vertical heights for the first curvilinear sidewall 131 and the second curvilinear sidewall 151 (e.g., in the Z direction or perpendicular to the second surface 110B of the base layer 110) that ranges from between about 7 µm to about 11 µm. Thus, the depth 195 of the indentation 160 may be equal to a distance that the indentation 160 extends upward from the bottom surface 150B of the second lower protection layer 150.

In some embodiments, the lateral combination of the first curvilinear sidewall 131 and the second curvilinear sidewall 151 (e.g., measured in the X direction parallel with the second surface 110B of the base layer 110 from the outer wall 119) may extend a first lateral distance 191 ranging from between about 8 µm to about 12 µm.

In the context of the foregoing embodiments it should be noted here that an adhesive material layer (e.g., an adhesive tape use in the handling of the interposer 100) is commonly attached to, and then detached from the second lower protection layer 150 during the manufacture of the interposer 100. Thus, should a discontinuous or stepped sidewall portion be formed (e.g., a discontinuous or stepped transition) between a second sidewall of the second lower protection layer 150 and a first sidewall of the first lower protection layer 130, some residue associated with the adhesive material layer may remain on the discontinuous or stepped transition. And unfortunately, this residue may later migrate to the pattern region PR and cause electrical failure(s).

However, in some embodiments, the second curvilinear sidewall 151 of the second lower protection layer 150 may be continuously (or smoothly) connected with the first curvilinear sidewall 131 of the first lower protection layer 130 without forming a discontinuous (or stepped) transition. As a result, certain electrical failures associated with the residue of an adhesive material layer used during handling of the interposer 100 may be avoided. This outcome improves the overall reliability of the interposer 100 and any semiconductor package including the interposer 100.

FIGS. 4, 5, 6 and 7 are respective cross-sectional views comparable to FIG. 3 and illustrating various interposers according to embodiments of the inventive concept. That is, FIGS. 4, 5, 6, and 7 respectively illustrate regions corresponding to the region III of FIG. 1.

Figure 4:
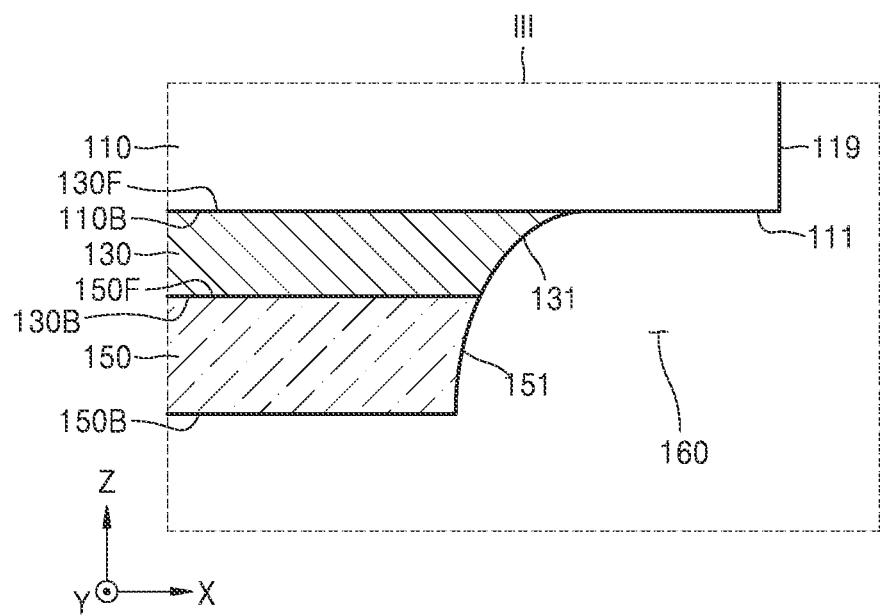
FIGS. 4, 5, 6 and 7 are respective cross-sectional views illustrating alternately versions of region III in FIG. 1 according to various embodiments of the inventive concept.

Referring to FIG. 4, the indentation 160 may include the second curvilinear sidewall 151 formed in the second lower protection layer 150 and the first curvilinear sidewall 131 formed in the first lower protection layer 130 and omitting the linear sidewall 133 formed in the first lower protection layer 130 of FIG. 3. Here, the indentation 160 extends fully from the bottom surface 150B of the second lower protection layer 150 to the top surface 130F of the first lower protection layer 130 leaving exposed a linear surface portion 111 of the second surface 110B of the base layer 110. Accordingly, the indentation 160 may be defined by the second curvilinear sidewall 151, the first curvilinear sidewall 131 and the linear surface portion 111 of the base layer 110.

As before, the second curvilinear sidewall 151 may continuously (or smoothly) transition upward through second protective layer 150 to the first curvilinear sidewall 131 without a discontinuous (e.g., a stepped) transition. Further, the first curvilinear sidewall 131 may extend fully through first lower protection layer 130, as compared with the embodiment illustrated in FIG. 3.

Figure 5:
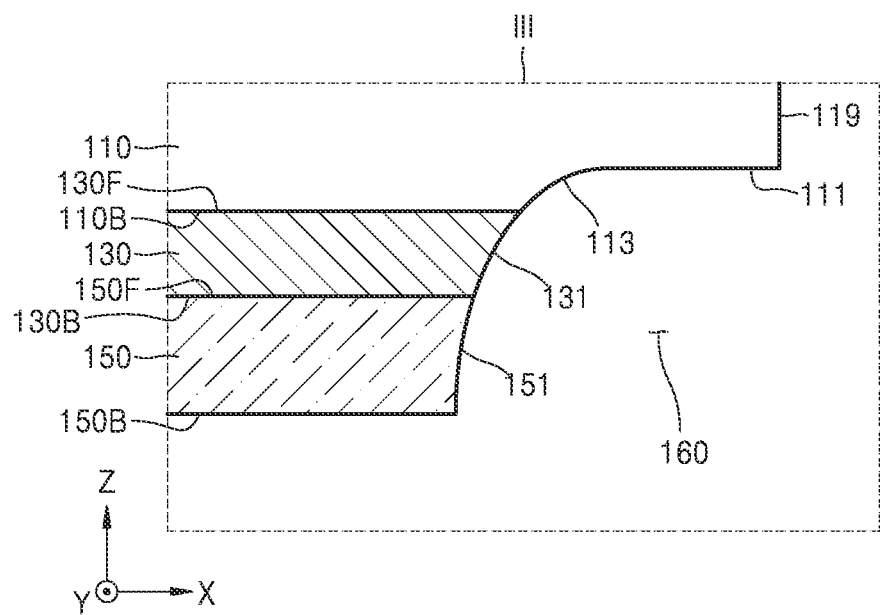

Referring to FIG. 5, the indentation 160 may include the second curvilinear sidewall 151 formed in the second lower protection layer 150, the first curvilinear sidewall 131 formed in the first lower protection layer 130, a third curvilinear sidewall 113 extending into a portion of the base layer 110, and a linear surface portion 111 formed in the base layer 110.

Consistent with the foregoing, the second curvilinear sidewall 151 may continuously (or smoothly) transition into the first curvilinear sidewall 131 without a discontinuous (e.g., a stepped) transition. Further, the first curvilinear sidewall 131 may continuously (or smoothly) transition into the third curvilinear sidewall 113 without a discontinuous (e.g., a stepped) transition. Still further, the third curvilinear sidewall 113 may continuously transition into the linear surface portion 111 of the base layer 110, thereby selectively exposing a lateral portion of the base layer 110.

Figure 6:
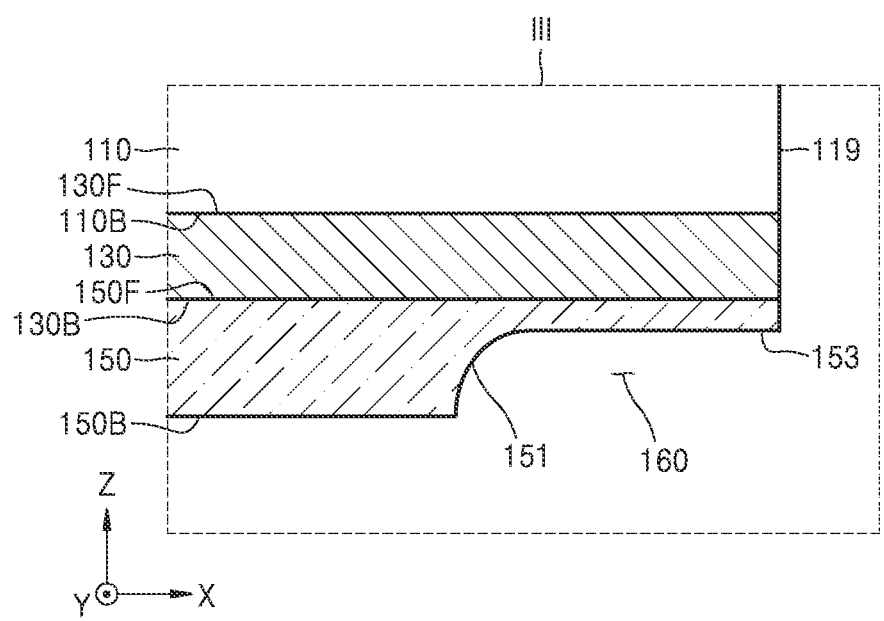

Referring to FIG. 6, the indentation 160 may include only the second curvilinear sidewall 151 and a linear surface portion 153 formed in the second lower protection layer 150. Thus, the indentation 160 may be formed by partially removing an outer edge region of the second lower protection layer 150. That is, the indentation 160 may extend partially into the second protection layer 150 from the bottom surface 150B of the second lower protection layer 150. The resulting combination of the second curvilinear sidewall 151 and the linear surface portion 153 defines the indentation 160 and selectively exposes a portion of the second lower protection layer 150.

In some embodiments, the linear surface portion 153 of the second lower protection layer 150 may extend in parallel with the second surface 110B of the base layer 110.

Figure 7:
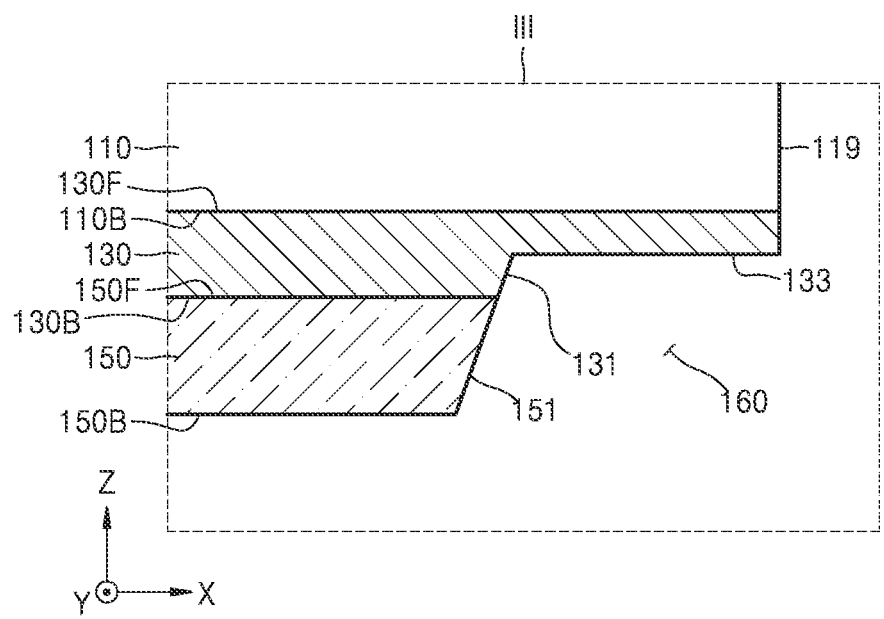

Up to this point various indentations have been described in terms of one or more curvilinear sidewall(s), but the inventive concept is not limited thereto. For example, the illustrated example of FIG. 7 shows an angled sidewall. That is, referring to FIG. 7, a second angled sidewall 151 may be formed in the second lower protection layer 150 and a first angled sidewall 131 may be formed in the first lower protection layer 150. Together with the linear surface portion 133, the second angled sidewall 151 and the first angled sidewall 131 may form the indentation 160. Here, the second angled sidewall 151 may have a straight profile extending at an angle through the second lower protective layer 150. Likewise, the first angular sidewall 131 may have a straight profile extending at least partially through the first lower protection layer 130 to reach the linear surface portion 133.

Here, however, the second angled sidewall 151 and the first angled sidewall 131 may be continuously connected at a border between the second lower protection layer 150 and the first lower protection layer 130. That is, the second angled sidewall 151 and the first angled sidewall 131 may extend with a same slope to avoid a discontinuous transition.

FIG. 8, including FIGS. 8A, 8B, 8C, 8D, 8E, 8F, 8G, 8H, 8I, 8J, 8K and 8M (collectively, "FIGS. 8A through 8M") are related cross-sectional views illustrating in one example a method of manufacturing an interposer according to embodiments of the inventive concept.

Figure 8A:
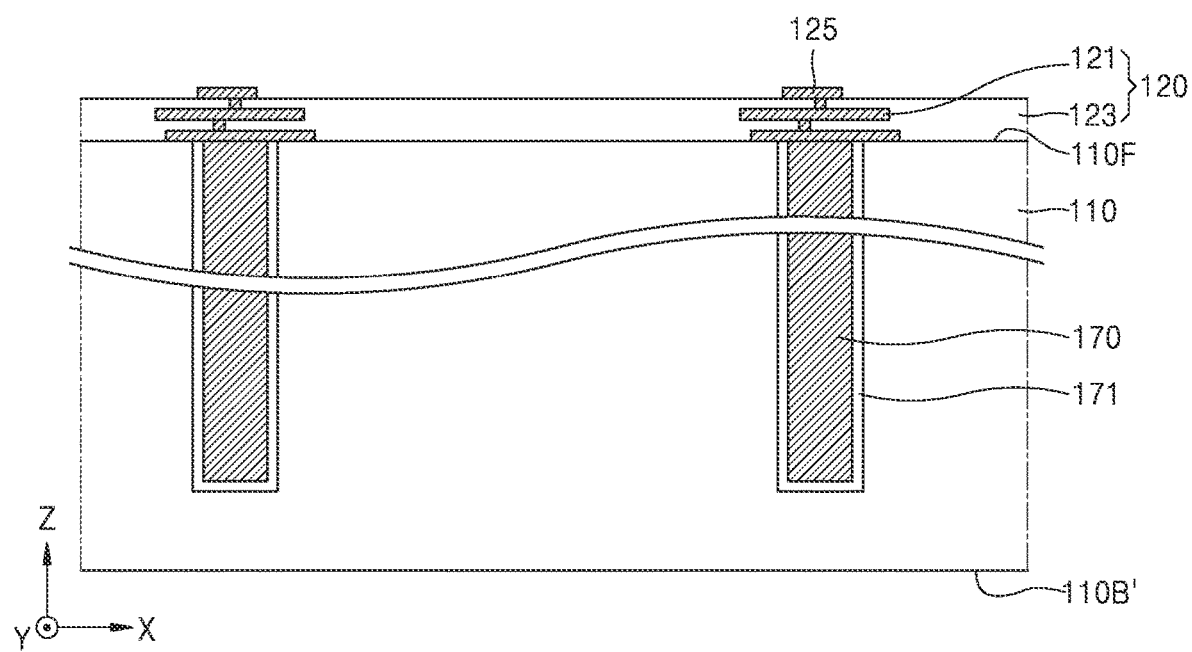
FIGS. 8A through 8M, illustrates in one example a method of manufacturing an interposer according to embodiments of the inventive concept.

Referring to FIG. 8A, the through electrode 170 is formed in the base layer 110 (e.g., a silicon wafer). Here, the through electrode 170 may extend from the first surface 110F towards a second surface 110B' of the base layer 110, yet does not pass completely through the base layer 110. Hence, the through electrode 170 may extend from the first surface 110F of the base layer 110 a certain distance towards the second surface 110B' of the base layer 110.

After the through electrode 170 is formed, the redistribution structure 120 may be formed on the first surface 110F of the base layer 110 by performing a redistribution process. As before, the redistribution structure 120 may generally include the conductive redistribution pattern 121 (including a wiring pattern) and the insulating layer 123 covering the conductive redistribution pattern 121.

After the redistribution structure 120 is formed, the upper conductive pad 125 may be formed on the redistribution structure 120. Here, the upper conductive pad 125 may be formed by patterning a conductive film (including e.g., Al, Ni, Cu, or a combination thereof) on the redistribution structure 120. The upper conductive pad 125 may then be variously connected to the conductive redistribution pattern 121 of the redistribution structure 120.

Figure 8B:
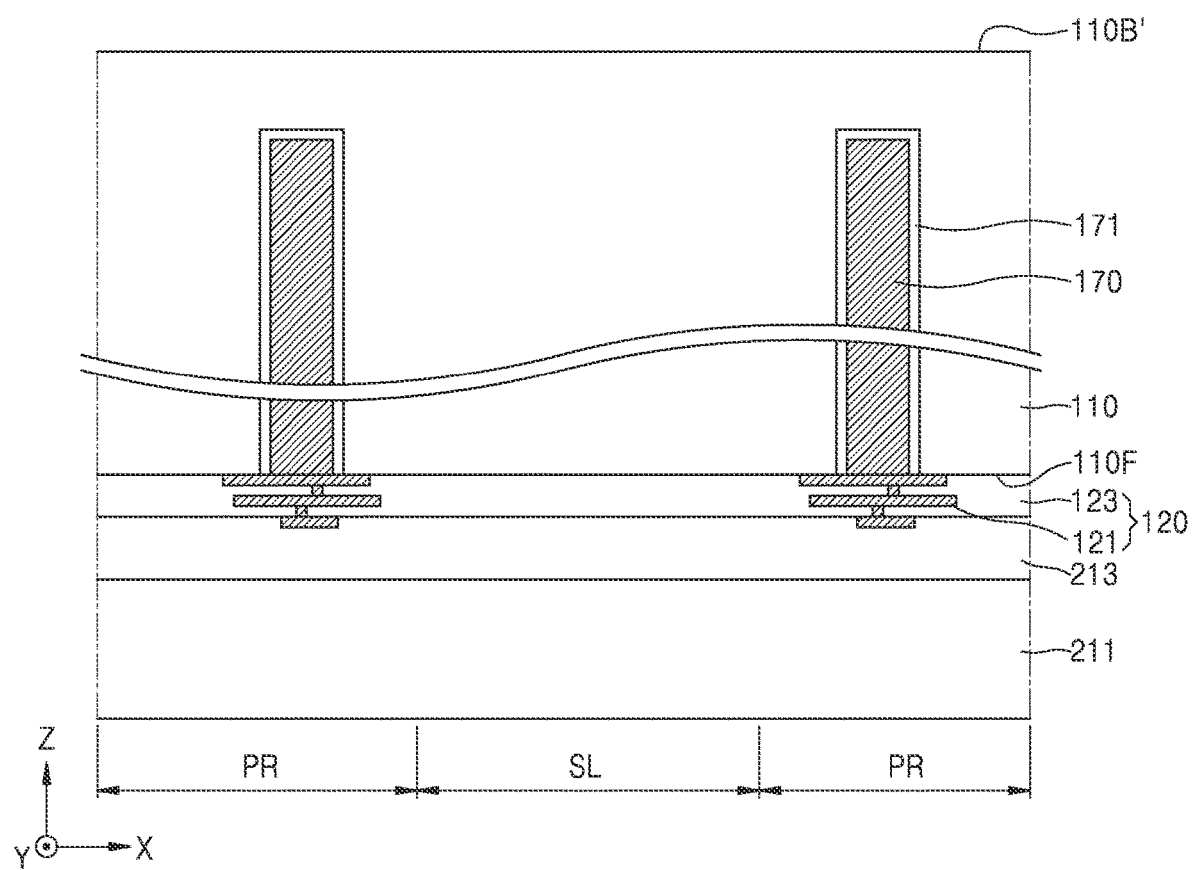

Referring further to FIG. 8B, the resultant structure of FIG. 8A may be flipped and attached to a first carrier substrate 211 (e.g., semiconductor substrate, a glass substrate, a ceramic substrate or a plastic substrate) using a first adhesive material layer 213. Once attached to the first carrier substrate 211, the first surface 110F of the base layer 110 will face the first carrier substrate 211.

Figure 8C:
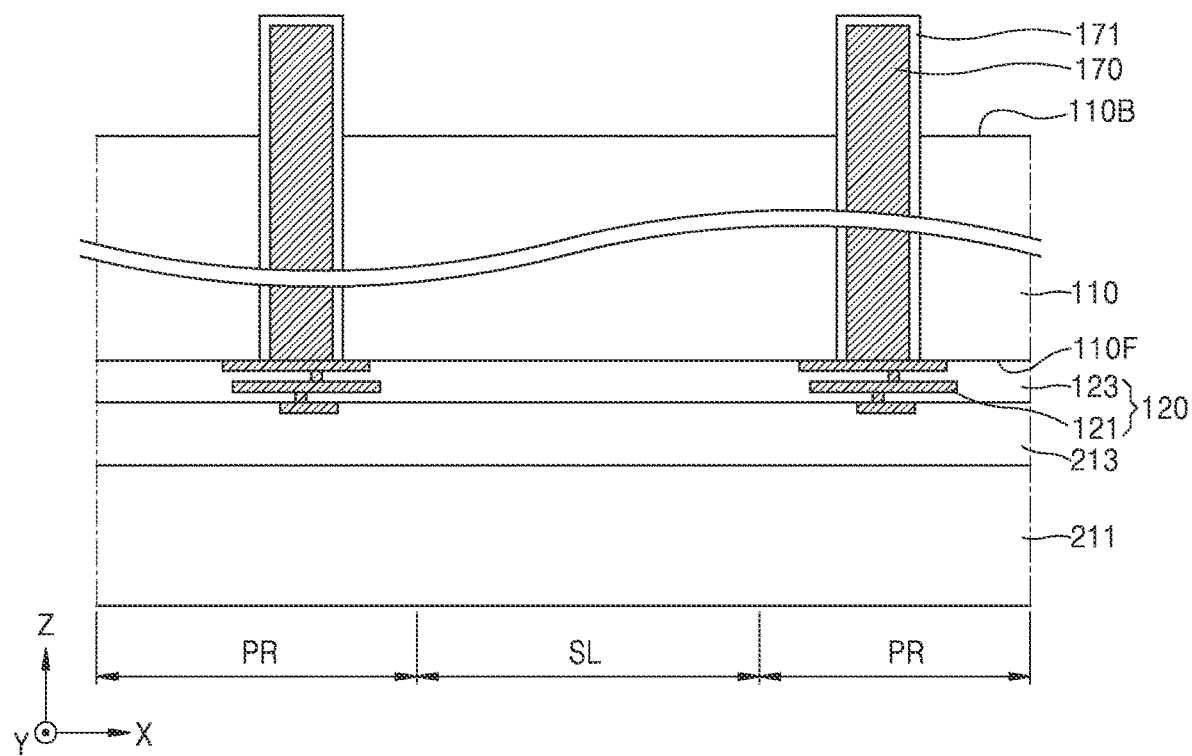

Referring to FIG. 8C, a portion of the base layer 110 may now be removed to expose part of the through electrode 170. That is, once a portion of the base layer 110 is removed, at least part of the through electrode 170 will be exposed through the second surface 110B of the base layer 110. In some embodiments, the desired portion of the base layer 110 may be removed using a planarization process, such as a chemical mechanical polishing (CMP) process on the resultant structure of FIG. 8B.

Figure 8D:
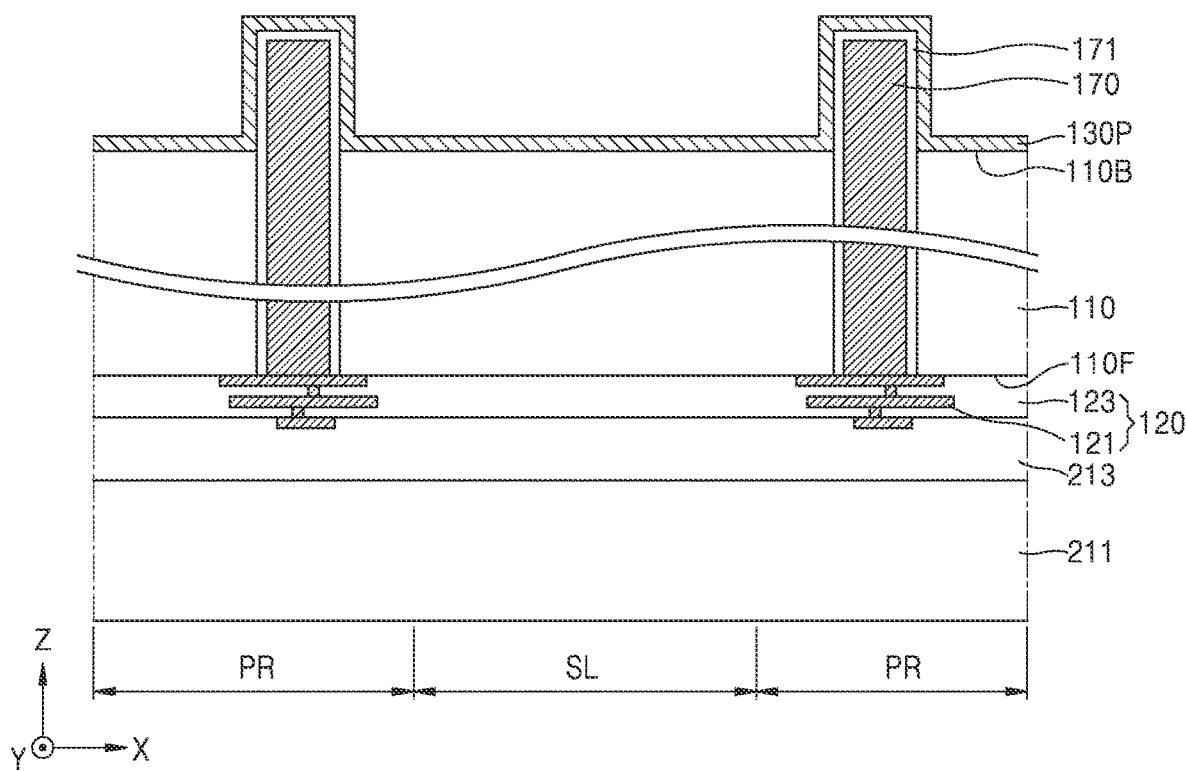

Referring to FIG. 8D, a first preliminary lower protection layer 130P may be formed to cover the second surface 110B of the base layer 110 and the exposed portion of the through electrode 170. In some embodiments, a PECVD process may be performed to form the first preliminary lower protection layer 130P, and the first preliminary lower protection layer 130P may include silicon oxide, silicon nitride, or a combination thereof.

Figure 8E:
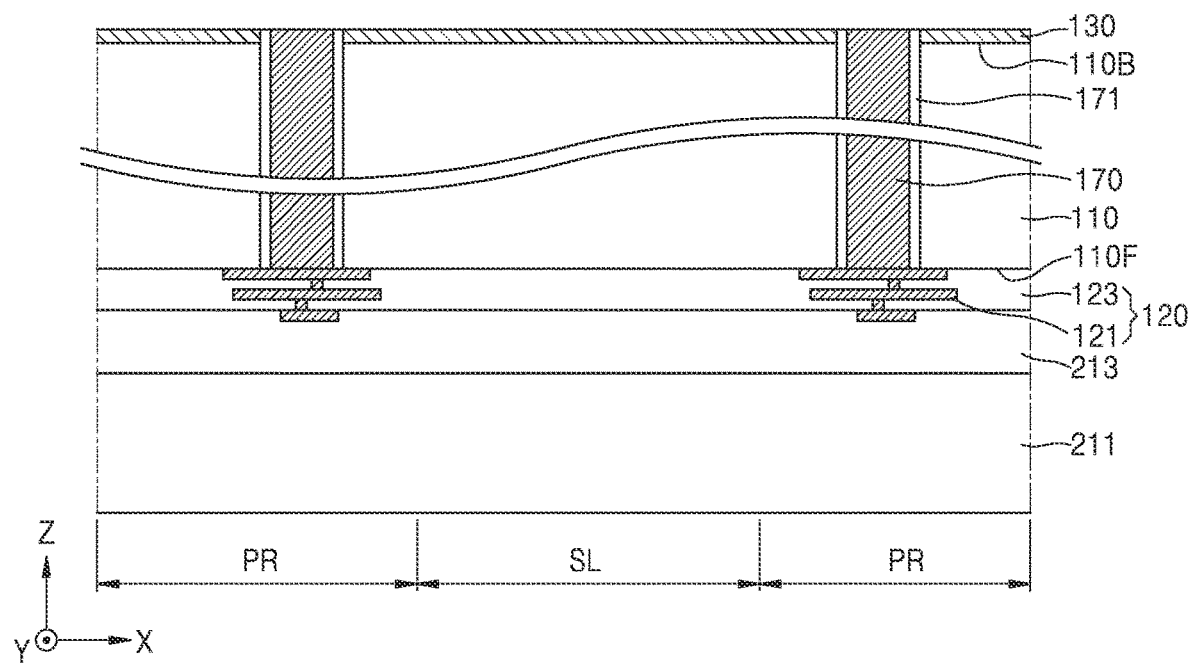

Referring to FIG. 8E, the first preliminary lower protection layer 130P and the via insulating film 171 may be partially removed to expose the through electrode 170. As a result of partially removing the first preliminary lower protection layer 130P, the first lower protection layer 130 may be formed to cover the second surface 110B of the base layer 110 and the sidewall of the through electrode 170 protruding from the second surface 110B of the base layer 110.

For example, a polishing process such as a CMP process may be performed to expose the through electrode 170. As a result of performing the polishing process, an exposed surface of the through electrode 170 may be coplanar with a surface of the first lower protection layer 130.

Figure 8F:
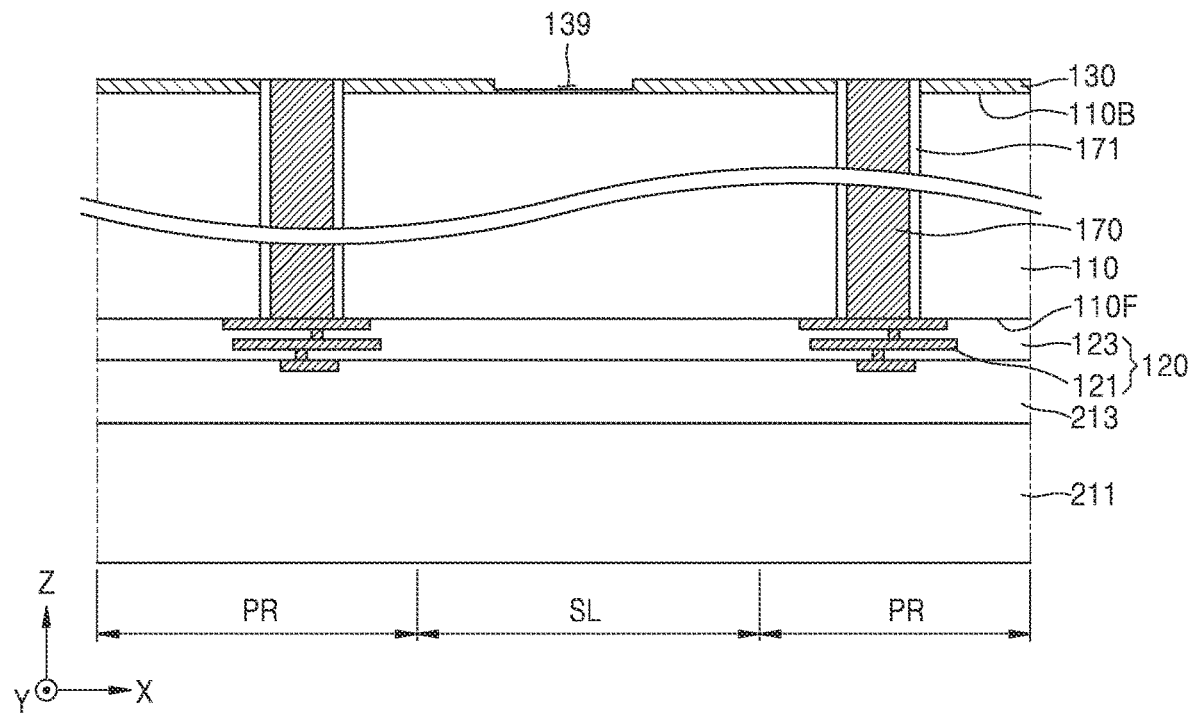

Referring to FIG. 8F, a recess 139 may be formed in the first lower protection layer 130. Here, the recess 139 may be formed in a region of the first lower protection layer 130 overlapping the remaining scribe lane region SLa of the base layer 110. The recess 139 may laterally extend (e.g., in the X direction and/or the Y direction) in a scribe lane region SL and may be used to recognize the scribe lane region SL during subsequent processes. The recess 139 is formed by partially removing the first lower protection layer 130, yet not passing through the first lower protection layer 130 such that the base layer 110 is exposed. The thickness of the first lower protection layer 130 in a region having the recess 139 may be less than the thickness of the first lower protection layer 130 around the recess 139. However, in some embodiments, the recess 139 may pass through the first lower protection layer 130, thereby partially exposing the second surface 110B of the base layer 110.

Figure 8G:
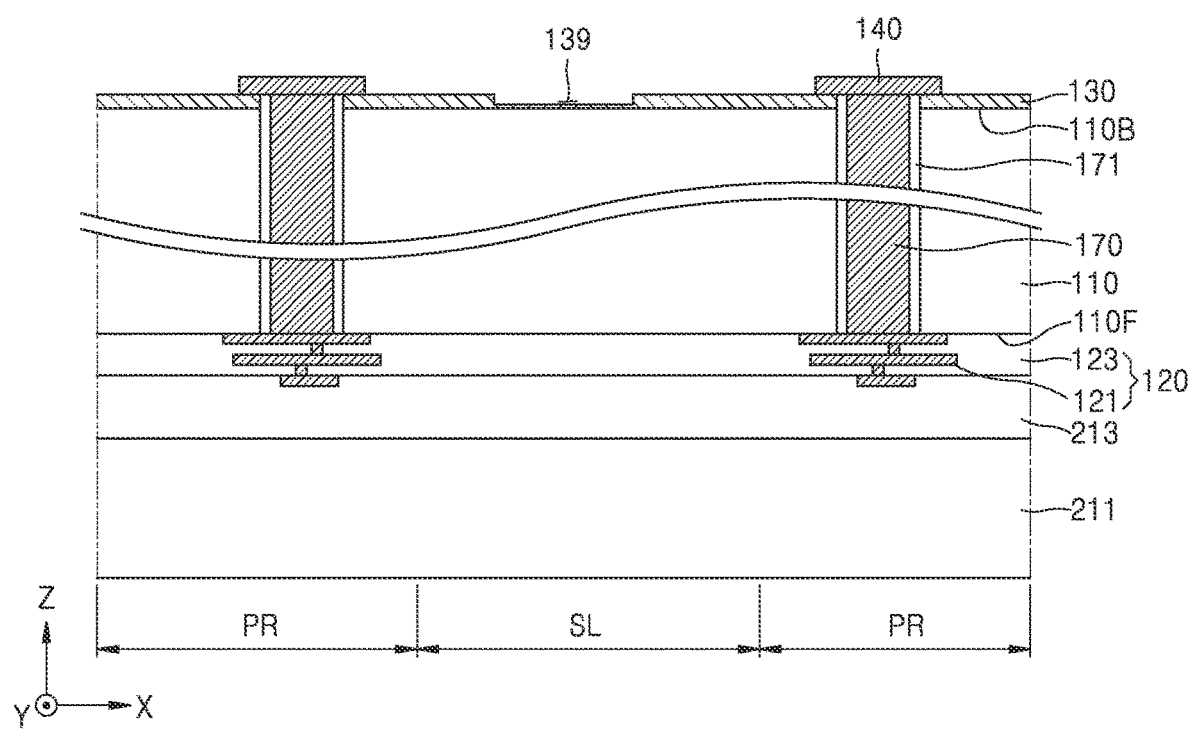

Referring to FIG. 8G, the lower conductive pad 140 may be formed on the first lower protection layer 130 and the through electrode 170 to electrically connect the through electrode 170. For example, to form the lower conductive pad 140, a conductive film may be formed on the first lower protection layer 130, and a patterning process may be performed on the conductive film.

Figure 8H:
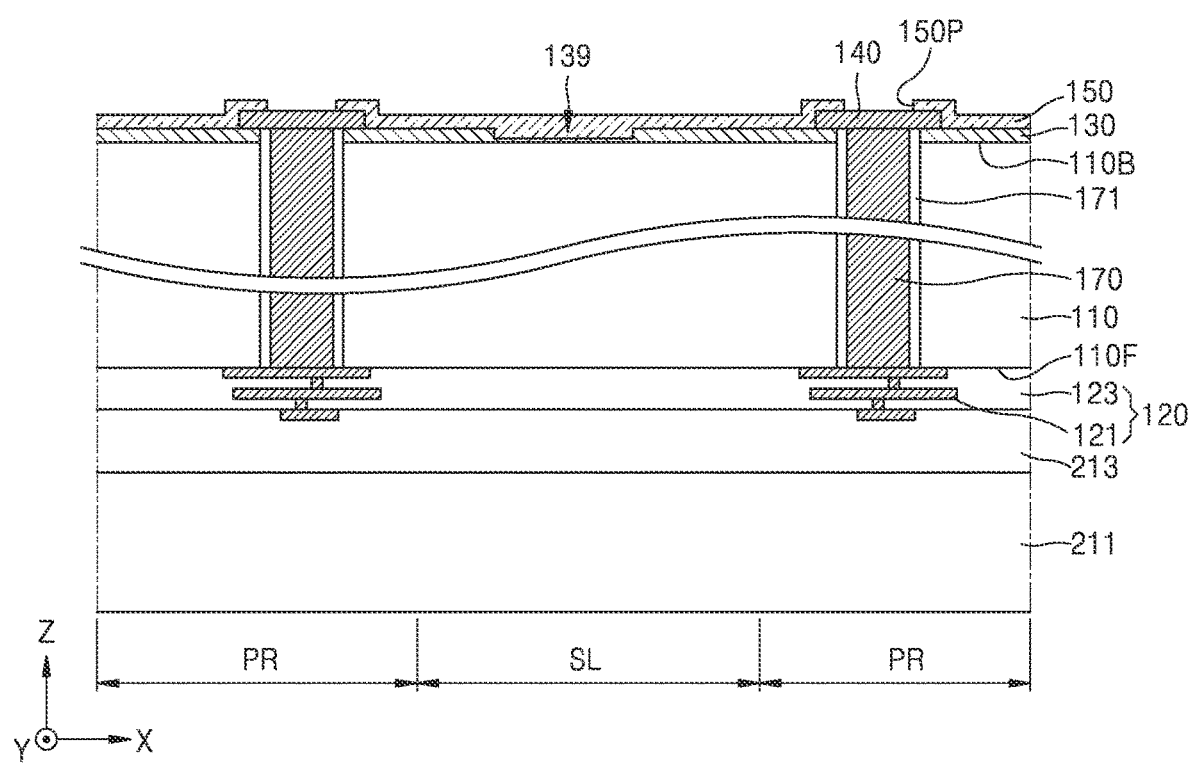

Referring to FIG. 8H, the second lower protection layer 150 may be formed on the first lower protection layer 130 after the lower conductive pad 140 is formed. The second lower protection layer 150 may cover the first lower protection layer 130 and a portion of the lower conductive pad 140. The second lower protection layer 150 may include an opening 150P partially exposing the lower conductive pad 140. The second lower protection layer 150 may fill the recess 139 of the first lower protection layer 130.

In some embodiments, the second lower protection layer 150 may include one or more organic material(s), such as PI or PBO.

Figure 8I:
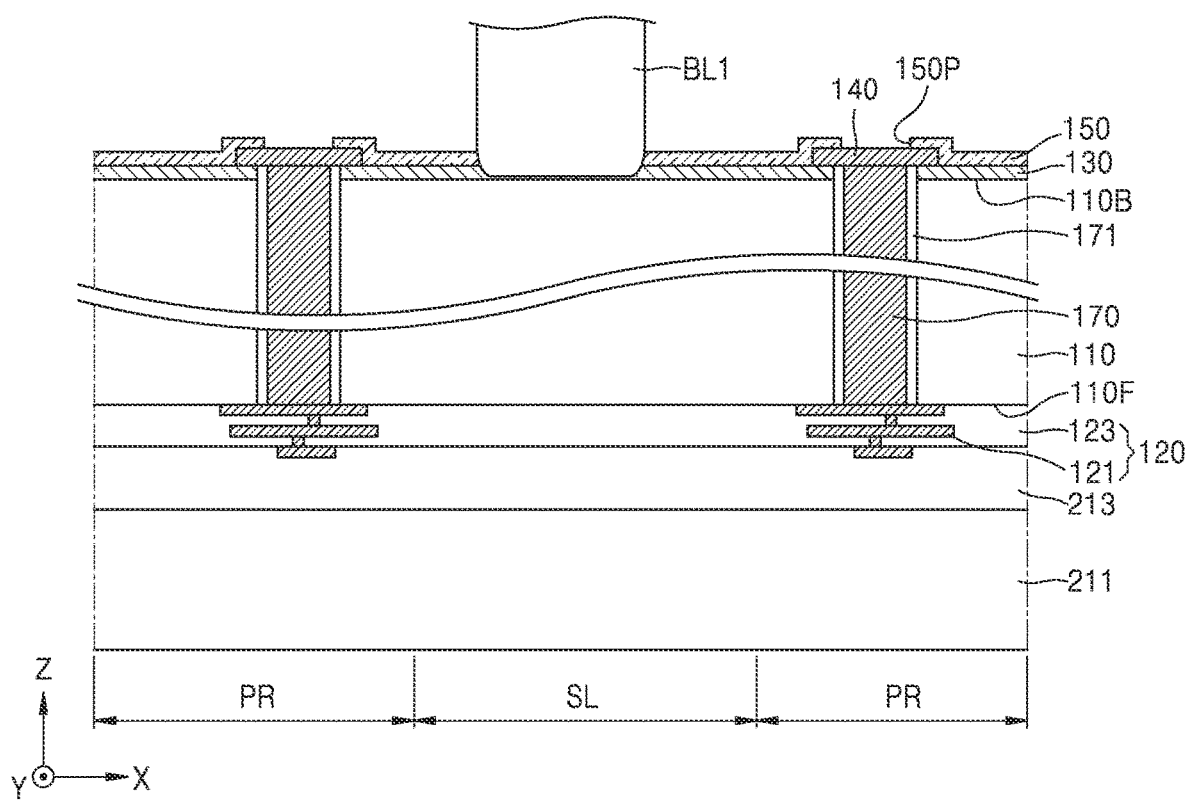
Figure 8J:
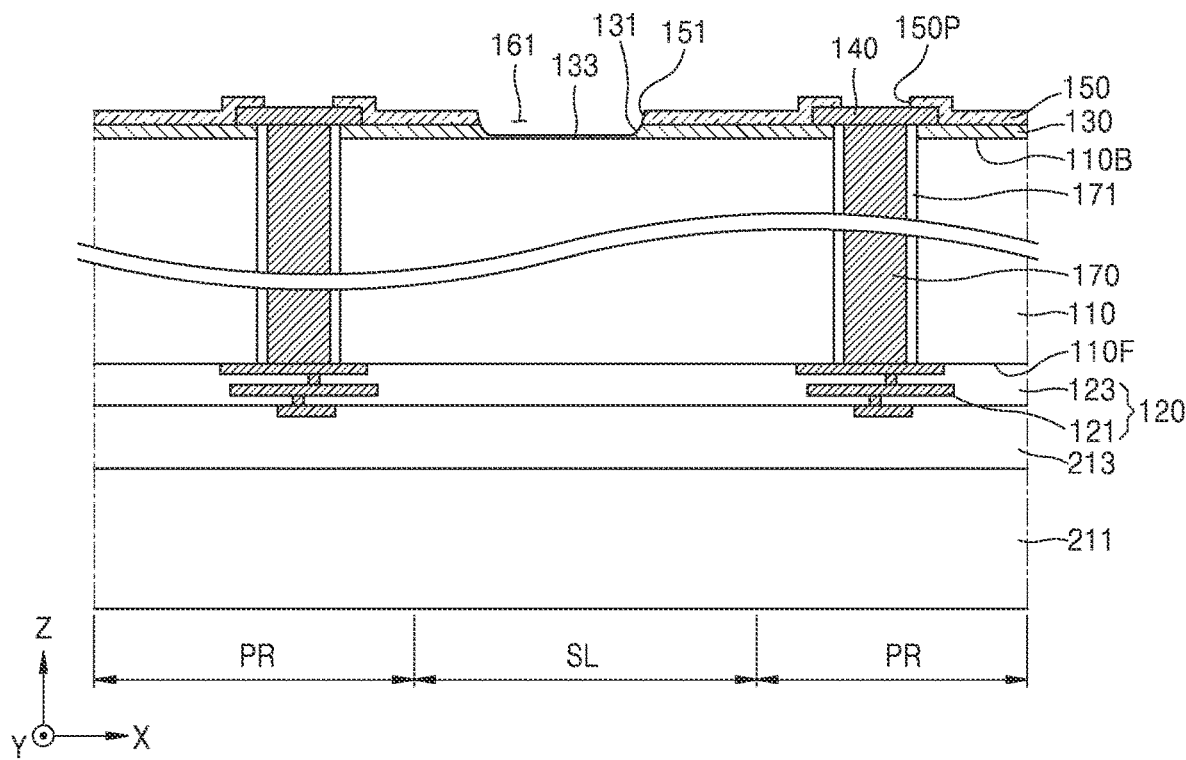

Referring to FIGS. 8I and 8J, after the second lower protection layer 150 is formed, an indentation 161 may be formed in portions of the second lower protection layer 150 and the first lower protection layer 130 covering the scribe lane region SL of the base layer 110. In some embodiments, this may be done using a first sawing blade BL1 and a sawing process that applies the first sawing blade BL1 to the scribe lane region SL of the base layer 110.

The resulting indentation 161 may have a width (e.g., about 300 μm to about 400 μm) that is slightly greater than a width of the original recess 139. Hence, all or some of the thickness of the first lower protection layer 130 may be removed.

Because the indentation 161 is formed by removing a portion of the second lower protection layer 150 and a portion of the first lower protection layer 130, the indentation 161 may be defined by a continuous combination of a second sidewall 151 associated with the second lower protection layer 150, a first sidewall 131 associated with the first lower protection layer 130, and a linear surface portion 133. Because portions of the second lower protection layer 150 and the first lower protection layer 130 are simultaneously removed by the constituent profile of the first sawing blade BL1, a continuous (e.g., non-stepped) transition between the first sidewall 131 and the second sidewall 151 may be achieved.

Thus, the respective profiles of the first sidewall 131 and the second sidewall 151 may be controlled by the choice of the first sawing blade BL1. For example, assuming that the outer edges of the first sawing blade BL1 have rounded cross-sections the first side wall 131 formed in the first lower protection layer 130 and the second sidewall 151 formed in the second lower protection layer 150 may be curvilinear in surface.

Figure 8K:
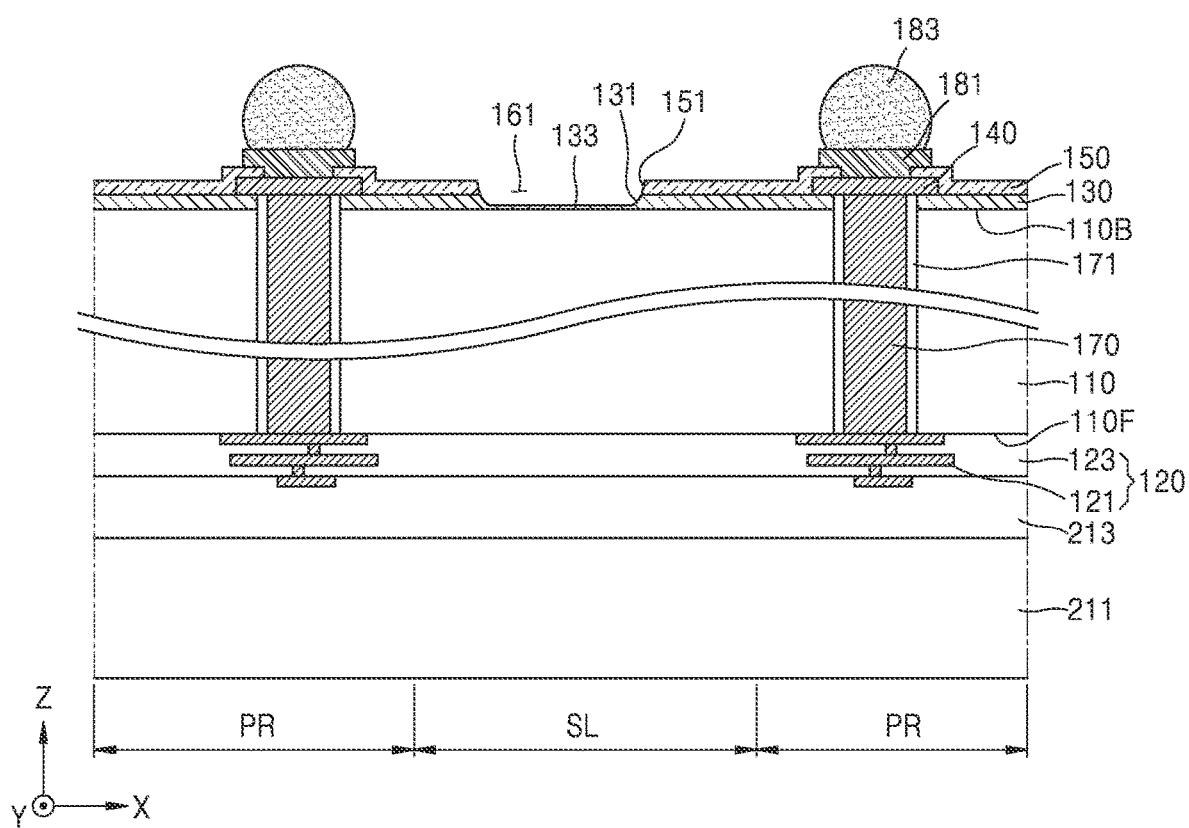

Referring to FIG. 8K, the lower connection pillar 181 may be formed on the lower conductive pad 140 exposed by the opening 150P (in FIG. 8J) of the second lower protection layer 150, and the board-to-interposer connector 183 may be formed on the lower connection pillar 181. In some embodiments, the board-to-interposer connector 183 may include a solder ball or a solder bump.

Figure 8L:
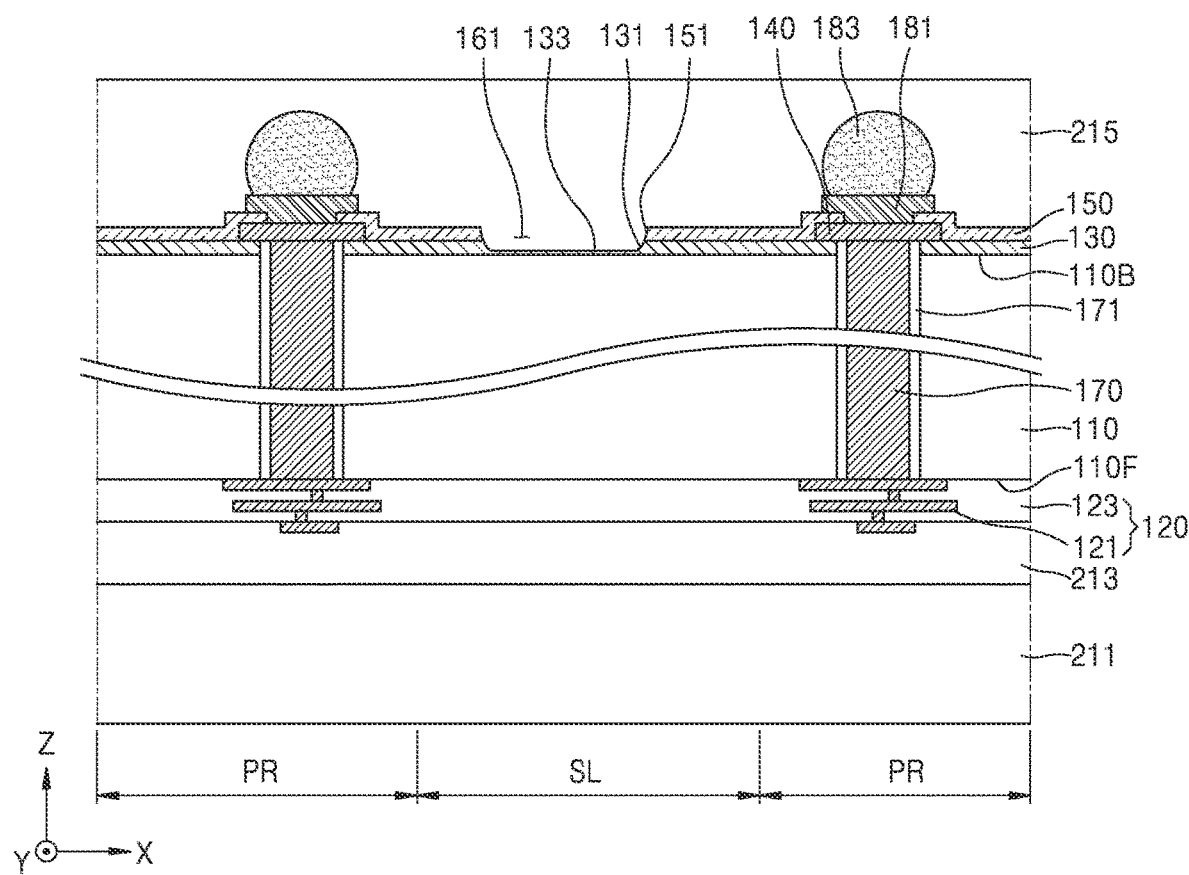

Referring to FIG. 8L, a second carrier substrate including a second adhesive material layer 215 may be attached to the resultant structure of FIG. 8K. The second carrier substrate may be used for easy handling of an intermediate output of the interposer 100 during subsequent manufacturing processes of the interposer 100. For example, the second carrier substrate may include a semiconductor substrate, a glass substrate, a ceramic substrate, or a plastic substrate. For example, the second adhesive material layer 215 may include a polymer containing a thermosetting material.

Figure 8M:
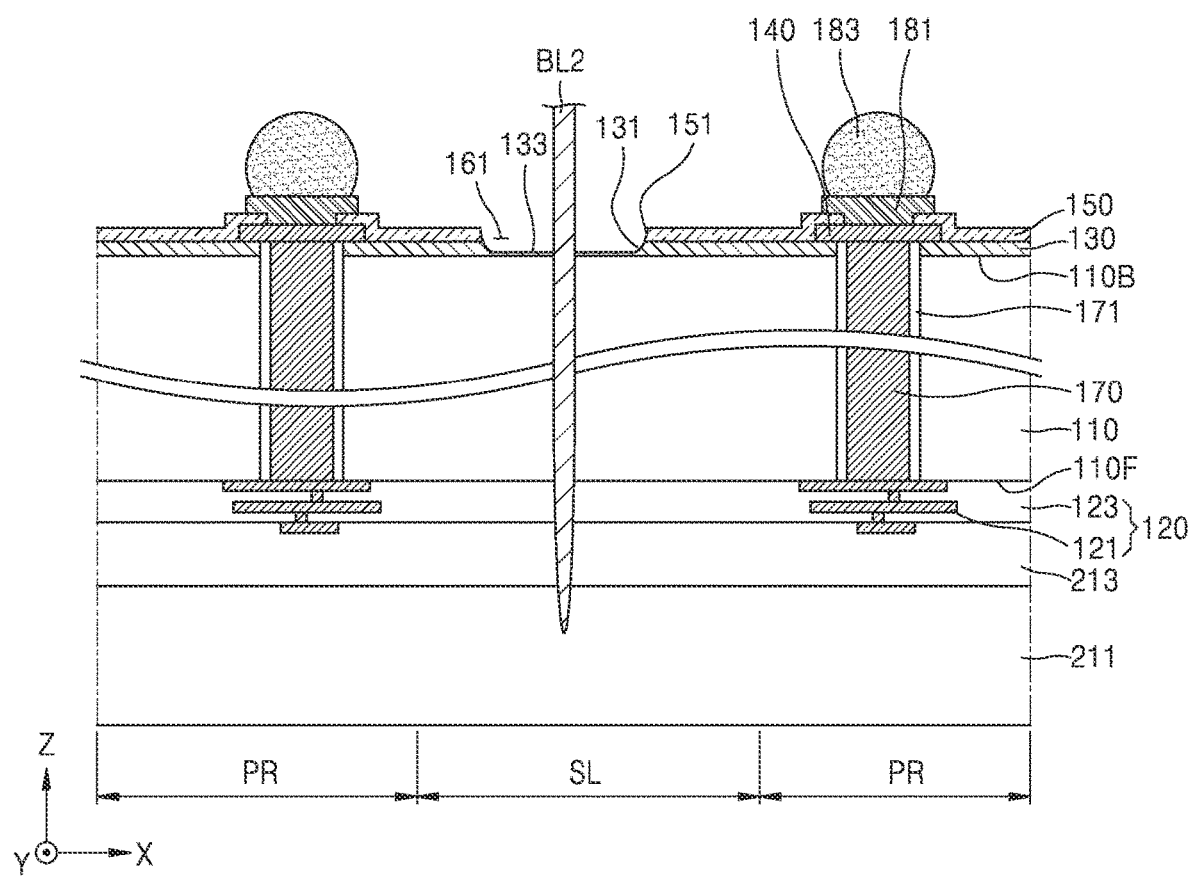

Referring to FIGS. 8L and 8M, the second carrier substrate including the second adhesive material layer 215 may be removed from the resultant structure of FIG. 8L. If there were a discontinuous (or stepped) portion in a surface portion formed by the indentation 161, an adhesive member might not fit tightly to this surface portion during the attaching of the adhesive member. Thereafter, during detachment of the adhesive member, some residue of the adhesive member may not be completely removed. However, in embodiments of the inventive concept, the second sidewall 151 of the second lower protection layer 150 and the first sidewall 131 of the first lower protection layer 130 are continuously (or smoothly) connected without a stepped portion there between. As a result, the second adhesive material layer 215 may be completely and tightly attached to the surface portion formed by the indentation 161, and residue may also be prevented from occurring after detachment of the second adhesive material layer 215.

After the second carrier substrate including the second adhesive material layer 215 is removed, another sawing process using a second sawing blade BL2 may be performed. The resultant structure of FIG. 8L having the second adhesive material layer 215 removed may be cut along the scribe lane region SL in the sawing process using the second sawing blade BL2.

The second sawing blade BL2 may have a narrower width than the first sawing blade BL1 (in FIG. 8I), and a width of a region cut away by the second sawing blade BL2 may be less than a width of the indentation 161. Accordingly, as a result of performing the second sawing process using the second sawing blade BL2, a portion of the scribe lane region SL may remain and form the remaining scribe lane region SLa (in FIG. 1) of the interposer 100 resulting from singulation using the sawing process.

Thereafter, the interposer 100 of FIGS. 1, 2 and 3 may be formed by removing the first adhesive material layer 213 and the first carrier substrate 211.

Figure 9:
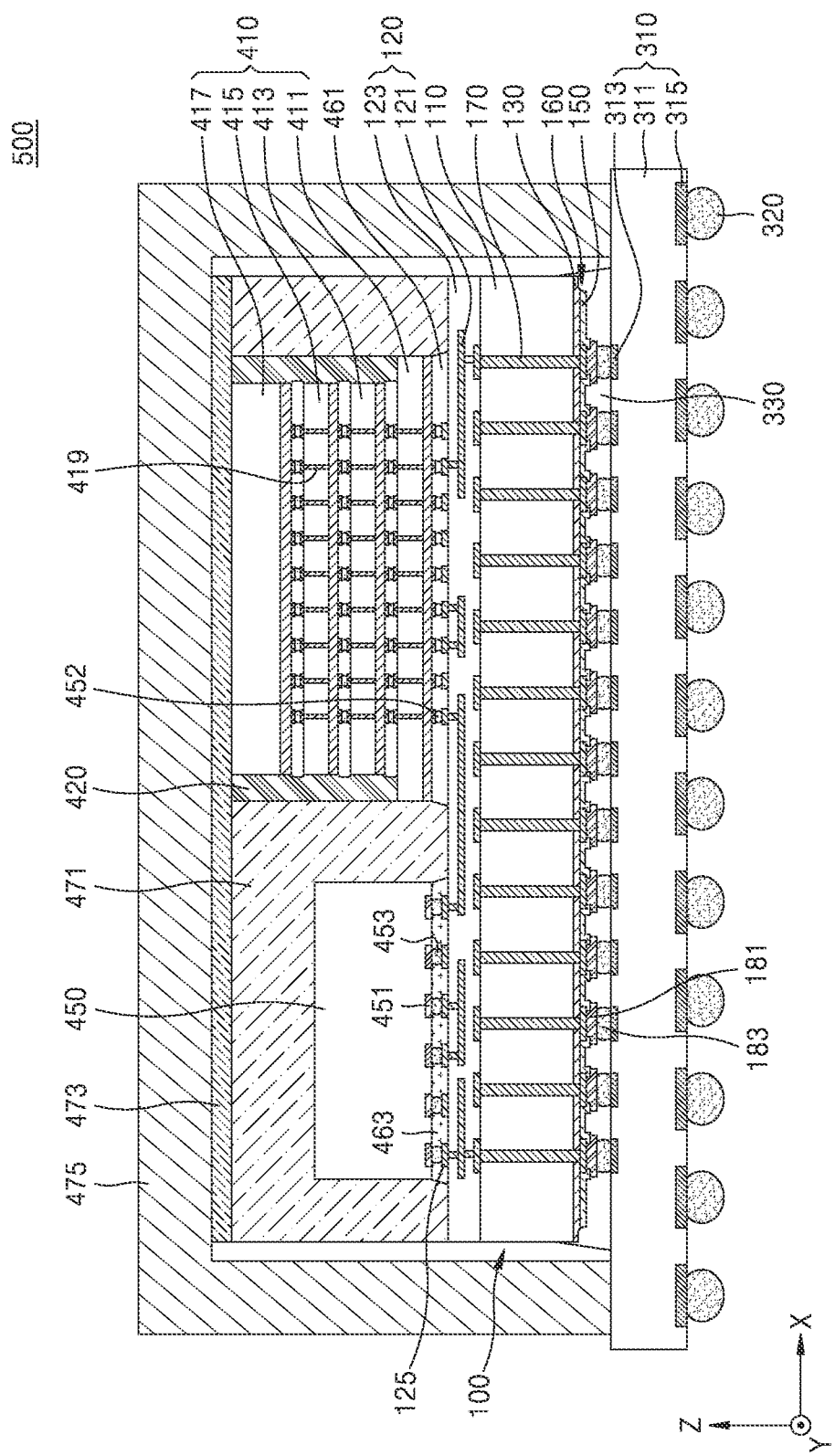
FIG. 9 is a cross-sectional view of a semiconductor package according to embodiments of the inventive concept.

FIG. 9 is a cross-sectional view of a semiconductor package 500 according to embodiments of the inventive concept.

Referring to FIG. 9, the semiconductor package 500 may include a package substrate 310, the interposer 100 mounted on the package substrate 310, and a first semiconductor device 410 and a second semiconductor device 450, which are mounted on the interposer 100. Although it is illustrated in FIG. 9 that the semiconductor package 500 includes the interposer 100 described with reference to FIGS. 1, 2 and 3, the semiconductor package 500 may include the interposer 100 described with reference to FIGS. 4, 5, 6 and 7.

The first semiconductor device 410 and the second semiconductor device 450 may be separated from each other in the horizontal direction on the redistribution structure 120. The first semiconductor device 410 and the second semiconductor device 450 may be electrically connected to each other through the conductive redistribution pattern 121 of the redistribution structure 120 of the interposer 100. The first semiconductor device 410 may be mounted on the interposer 100 through a first chip connector 452, and the second semiconductor device 450 may be mounted on the interposer 100 through a second chip connector 453 bonded to a pad 451 of the second semiconductor device 450. A first underfill material layer 461 covering first chip connectors 452 may be arranged between the first semiconductor device 410 and the interposer 100, and a second underfill material layer 463 covering second chip connectors 453 may be arranged between the second semiconductor device 450 and the interposer 100.

Although two semiconductor devices are mounted on the interposer 100 in FIG. 9, the semiconductor package 500 may include at least three semiconductor devices on the interposer 100.

In some embodiments, the first semiconductor device 410 may include a stacked memory device. For example, the first semiconductor device 410 may include a buffer die 411 and a plurality of core dies 413, 415, and 417. For example, the buffer die 411 may be referred to as an interface die, a base die, a logic die, or a master die. The core dies 413, 415, and 417 may be referred to as memory dies or slave dies. Although the first semiconductor device 410 includes three core dies 413, 415, and 417 in FIG. 9, the number of core dies may be variously changed. For example, the first semiconductor device 410 may include four, eight, twelve, or sixteen core dies.

Each of the buffer die 411 and the core dies 413, 415, and 417 may include a through silicon via (TSV) 419. The buffer die 411 and the core dies 413, 415, and 417 may be stacked on and electrically connected to each other through TSVs 419 Accordingly, the first semiconductor device 410 may have a three-dimensional (3D) memory structure, in which a plurality of dies are stacked. For example, the first semiconductor device 410 may be implemented based on a high bandwidth memory (HBM) or hybrid memory cube (HMC) standard.

Each of the core dies 413, 415, and 417 may include a memory cell array. The buffer die 411 may include a physical layer and a direct access region. The physical layer of the buffer die 411 may include interface circuits for communication with an external host device and may be electrically connected to the second semiconductor device 450 through the interposer 100. The first semiconductor device 410 may receive signals from or transmit signals to the second semiconductor device 450 through the physical layer. Signals and/or data received through the physical layer of the buffer die 411 may be transmitted to the core dies 413, 415, and 417 through the TSVs 419. The direct access region may provide an access path, through which the first semiconductor device 410 is tested without going through the second semiconductor device 450. The direct access region may include a conductive element (e.g., a port or a pin), which may directly communicate with an external tester.

An insulating adhesive layer may be between the buffer die 411 and the core die 413 or between two adjacent core dies among the core dies 413, 415, and 417. For example, the insulating adhesive layer may include a non-conductive film (NCF), non-conductive paste (NCP), an insulating polymer, or epoxy resin. The first semiconductor device 410 may further include a molding layer 420, which covers side surfaces of the buffer die 411 and the core dies 413, 415, and 417. For example, the molding layer 420 may include an epoxy mold compound (EMC).

For example, the second semiconductor device 450 may include a system-on-chip, a central processing unit (CPU) chip, a graphics processing unit (GPU) chip, or an application processor (AP) chip.

The second semiconductor device 450 may execute applications, which the semiconductor package 500 supports, using the first semiconductor device 410. For example, the second semiconductor device 450 may include at least one process selected from a CPU, an AP, a GPU, a neural processing unit (NPU), a tensor processing unit (TPU), a vision processing unit (VPU), an image signal processor (ISP), and a digital signal processor (DSP) and may execute specialized operations.

The second semiconductor device 450 may include a physical layer and a memory controller. The physical layer of the second semiconductor device 450 may include input/output circuits, which transmit and receive signals to and from the physical layer of the first semiconductor device 410. The second semiconductor device 450 may provide, through the physical layer thereof, various signals to the physical layer of the first semiconductor device 410. The memory controller may generally control operations of the first semiconductor device 410. The memory controller may transmit signals for controlling the first semiconductor device 410 to the first semiconductor device 410 through the conductive redistribution pattern 121 of the interposer 100.

The semiconductor package 500 may further include a package molding layer 471, which is arranged on the interposer 100 and molds the first semiconductor device 410 and the second semiconductor device 450. For example, the package molding layer 471 may include an EMC. In embodiments, the package molding layer 471 may cover a top surface of the interposer 100, a side surface of the first semiconductor device 410, and a side surface of the second semiconductor device 450 but not a top surface of the first semiconductor device 410 and a top surface of the second semiconductor device 450.

The semiconductor package 500 may further include a heat dissipation unit 475, which covers the top surfaces of the first semiconductor device 410 and the second semiconductor device 450. The heat dissipation unit 475 may include a heat slug or a heat sink. In embodiments, the heat dissipation unit 475 may be arranged on a top surface of the package substrate 310 to surround the first semiconductor device 410, the second semiconductor device 450, and the interposer 100.

The semiconductor package 500 may further include a thermal interface material 473. The thermal interface material 473 may be between the heat dissipation unit 475 and the first semiconductor device 410 and between the heat dissipation unit 475 and the second semiconductor device 450.

The package substrate 310 may be electrically connected to the interposer 100 through the board-to-interposer connector 183. An underfill material layer 330 may be between the interposer 100 and the package substrate 310. The underfill material layer 330 may surround board-to-interposer connectors 183.

In some embodiments, the underfill material layer 330 may partially cover the outer wall 119 (in FIG. 3) of the base layer 110 of the interposer 100. The underfill material layer 330 may also cover a surface portion of the first lower protection layer 130 and a surface portion of the second lower protection layer 150, which are formed by the indentation 160. For example, the underfill material layer 330 may cover the first sidewall 131 (in FIG. 3) of the first lower protection layer 130 and the second sidewall 151 (in FIG. 3) of the second lower protection layer 150, which are near the outer region of the base layer 110.

The package substrate 310 may include a substrate base 311, a substrate upper pad 313 on a top surface of the substrate base 311, and a substrate lower pad 315 on a bottom surface of the substrate base 311. In embodiments, the package substrate 310 may include a PCB. For example, the package substrate 310 may include a multi-layer PCB. The substrate base 311 may include at least one material selected from phenol resin, epoxy resin, and PI. A board-to-interposer connector 183 may be connected to the substrate upper pad 313, and a package connector 320 configured to electrically connect the semiconductor package 500 to an external device may be connected to the substrate lower pad 315.

According to some embodiments, the second sidewall 151 of the second lower protection layer 150 may be continuously connected to the first sidewall 131 of the first lower protection layer 130 without including stepped transition between the second sidewall 151 and the first sidewall 131. Accordingly, electrical failure may be prevented from occurring due to the residue of the adhesive material layer, e.g., adhesive tape, used for handling of the interposer 100 during the manufacture of the interposer 100, and therefore, the reliability of the semiconductor package 500 manufactured using the interposer 100 may be increased.

While the inventive concept has been particularly shown and described with reference to embodiments thereof, it will be understood that various changes in form and details may be made therein without departing from the spirit and scope of the following claims.

What is claimed is:

1. A semiconductor package comprising:
a package substrate;
an interposer mounted on the package substrate; and
a semiconductor chip mounted on the interposer,
wherein the interposer comprises
a base layer including a first surface and a second surface opposite the first surface,
a redistribution structure on the first surface of the base layer, configured to mount the semiconductor chip and including a conductive redistribution pattern,
a first lower protection layer on the second surface of the base layer,
a lower conductive pad on the first lower protection layer,
a through electrode passing through the base layer and the first lower protection layer to electrically connect the conductive redistribution pattern to the lower conductive pad,
a second lower protection layer on the first lower protection layer and contacting at least a portion of the lower conductive pad, and
an indentation formed in an outer edge region of the interposer to provide a continuous sidewall extending through the second lower protection layer and through at least a portion of the first lower protection layer,
wherein the continuous sidewall includes a second curvilinear sidewall extending entirely through the second lower protection layer, and a first curvilinear sidewall extending through the at least a portion of the first lower protection layer, and the continuous sidewall is smooth without discontinuous transitions, and
wherein the continuous sidewall further includes a linear sidewall extending within the indentation from the first curvilinear sidewall to an outer wall of the interposer.

2. The semiconductor package of claim 1, wherein the linear sidewall extends in parallel with the second surface of the base layer.

3. The semiconductor package of claim 1, wherein a sum of a first height for the first curvilinear sidewall and a second height for the second curvilinear sidewall ranges from between about 7 μm to about 11 μm,
a sum of a first length for the first curvilinear sidewall and a second length for the second curvilinear sidewall ranges from between about 8 μm to about 12 μm,
the first height and the second height being measured in a direction substantially perpendicular to the second surface of the base layer, and
the first length and the second length being measured in a direction substantially parallel to the second surface of the base layer.

4. The semiconductor package of claim 1, further comprising:
a connector disposed on the lower conductive pad through an opening in the second lower protection layer, wherein the interposer is mounted on the package substrate by the connector.

5. The semiconductor package of claim 4, further comprising:
an underfill material layer between the package substrate and the second lower protection layer, wherein the underfill material layer surrounds the connector and covers at least a portion of the continuous sidewall.

6. The semiconductor package of claim 1, wherein the first lower protection layer includes an inorganic material, and the second lower protection layer includes an organic material.

7. An interposer comprising:
a base layer including a first surface and a second surface opposite the first surface;
a redistribution structure on the first surface of the base layer and including a conductive redistribution pattern;
a first lower protection layer on the second surface of the base layer;
a lower conductive pad on the first lower protection layer;
a through electrode connecting the conductive redistribution pattern and the lower conductive pad;
a second lower protection layer on the first lower protection layer and contacting at least a portion of the lower conductive pad; and
an indentation formed in a scribe lane region proximate to an outer edge region of the interposer to provide a continuous curvilinear sidewall extending entirely through the second lower protection layer and through a portion of the first lower protection layer without extending entirely through the first lower protection layer,
the continuous curvilinear sidewall includes a linear sidewall within the indentation that extends substantially parallel with the second surface of the base layer to an outer wall of the interposer.

8. The interposer of claim 7, wherein the first lower protection layer includes a different material than the second lower protection layer.

9. The interposer of claim 7, wherein the continuous curvilinear sidewall includes a second curvilinear sidewall extending entirely through the second lower protection layer, a first curvilinear sidewall extending through the portion of the first lower protection layer, and the linear sidewall extending from the first curvilinear sidewall.

10. An interposer comprising:
a base layer including a first surface and a second surface opposite the first surface;
a redistribution structure on the first surface of the base layer and including a conductive redistribution pattern;
a first lower protection layer on the second surface of the base layer;
a lower conductive pad on the first lower protection layer;
a through electrode connecting the conductive redistribution pattern and the lower conductive pad;
a second lower protection layer on the first lower protection layer, including a different material than the first lower protection layer, and contacting at least a portion of the lower conductive pad; and
an indentation formed in an outer edge region of the interposer to provide a continuous angled sidewall extending entirely through the second lower protection layer and through a portion of the first lower protection layer without extending entirely through the first lower protection layer,
the continuous angled sidewall including a linear surface portion extending substantially parallel with the second surface of the base layer to an outer wall of the interposer.

11. The interposer of claim 10, wherein the continuous angled sidewall includes a second angled sidewall extending entirely through the second lower protection layer, and a first angled sidewall extending through the portion of the first lower protection layer.

* * * * *